United States Patent [19]
Howard

[11] Patent Number: 6,046,505
[45] Date of Patent: Apr. 4, 2000

[54] METHOD FOR FORMING A CONTACT DURING THE FORMATION OF A SEMICONDUCTOR DEVICE

[75] Inventor: Bradley J. Howard, Boise, Id.

[73] Assignee: Micron Technology, Inc., Boise, Id.

[21] Appl. No.: 08/968,564

[22] Filed: Nov. 12, 1997

Related U.S. Application Data

[63] Continuation of application No. 08/500,293, Jul. 10, 1995, Pat. No. 5,686,357.

[51] Int. Cl.[7] .................................................... H01L 29/45
[52] U.S. Cl. .......................... 257/776; 257/773; 257/377; 257/382
[58] Field of Search .................................... 257/382, 377, 257/773, 401, 343, 374, 776

[56] References Cited

U.S. PATENT DOCUMENTS

| | | | |
|---|---|---|---|
| 5,114,879 | 5/1992 | Madan | 437/195 |
| 5,146,291 | 9/1992 | Watabe et al. | |
| 5,264,391 | 11/1993 | Son et al. | 437/195 |
| 5,290,720 | 3/1994 | Cher | |
| 5,411,906 | 5/1995 | Johnson et al. | |
| 5,473,184 | 12/1995 | Murai | 257/382 |

OTHER PUBLICATIONS

S. Wolf "Silicon Processing for the VLSI Era vol. 2" Lattice Press, Calif. (1990) p. 199.

*Primary Examiner*—Caridad Everhart

[57] ABSTRACT

A method for forming a semiconductor device comprises the steps of forming first and second conductive lines having a space therebetween over a substrate, said first and second conductive lines each having a sidewall. A conductive spacer is formed over each sidewall, and an insulation layer is formed over the conductive spacers. First and second portions of the insulation is removed to form first and second openings therein, thereby exposing the spacers. The exposed portions of the spacers are removed. The conductive spacers form a conductive path between the first and second openings which would short any conductor formed in the first and second openings. To prevent shorting, a second protective layer is formed within the first and second openings which covers a portion of the spacers to remove the conductive path.

12 Claims, 7 Drawing Sheets

METHOD FOR FORMING A CONTACT DURING THE FORMATION OF A SEMICONDUCTOR DEVICE

This is a continuation of application Ser. No. 08/500,293 filed Jul. 10, 1995 and issued Nov. 11, 1997 as U.S. Pat. No. 5,686,357.

FILED OF THE INVENTION

The invention relates to the field of semiconductor manufacture, and more particularly to a process for forming an opening in a layer, for example in an insulator layer, to contact an underlying layer.

BACKGROUND OF THE INVENTION

To form a semiconductor device, contacts or other openings, for example in an oxide, are often formed to expose an underlying layer such as a wafer, a metal layer, a polycrystalline silicon layer, or various other layers. To protect a desirable layer, such as a word line or a digit line over the layer to be exposed, an etch stop layer or a sacrificial layer is formed over the desirable layer. The sacrificial layer often comprises silicon nitride. During the removal of an oxide layer, the silicon nitride etch stop layer can also be removed albeit usually at a slower rate than the oxide removal. The erosion of the silicon nitride layer can cause problems, for example if the underlying layer is exposed and erosion begins on the underlying layer.

A process sequence which protects a desirable layer more efficiently than previous process sequences would be advantageous.

SUMMARY OF THE INVENTION

A method for forming a semiconductor device comprises the steps of forming an insulation layer having first and second openings therein. The openings, by way of the inventive process, are electrically connected by an electrically conductive spacer such as polycrystalline silicon. Subsequently, a protective layer is formed in at least one of the openings to isolate the electrical connection between the first and second openings.

Objects and advantages will become apparent to those skilled in the art from the following detailed description read in conjunction with the appended claims and the attached drawings.

DETAILED DESCRIPTION OF THE INVENTION

Figure 1:
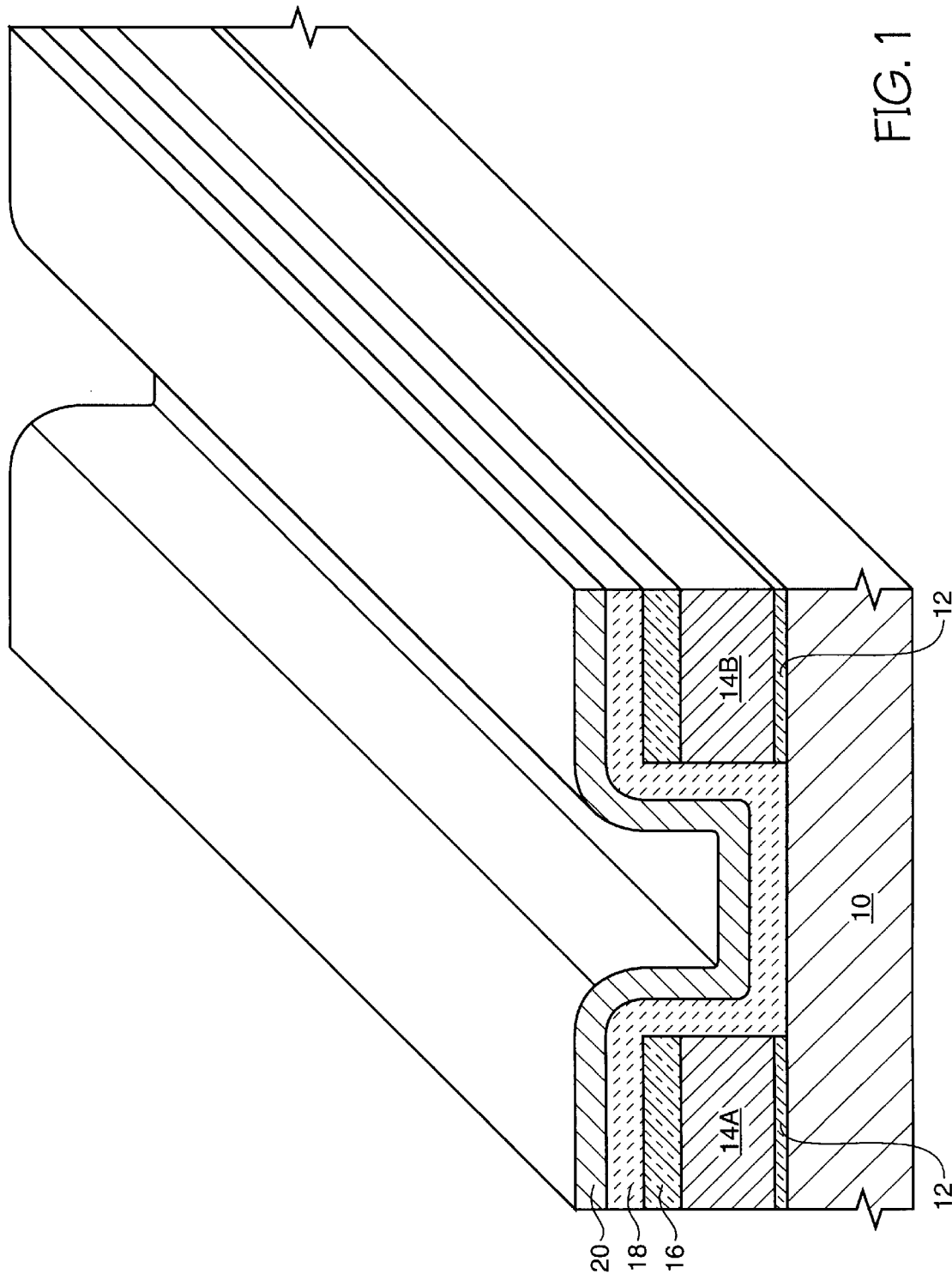
FIGS. 1–4 and 6–7 are isometric cross-sectional views showing one inventive embodiment.

FIG. 1 shows a starting structure for forming a semiconductor device comprising an underlying layer 10, which in this embodiment is a semiconductor wafer substrate. Overlying the substrate 10 is a gate oxide layer 12, a first conductive line 14A and a second conductive line 14B having a space therebetween and each having a sidewall. The conductive lines can be word lines, digit lines, or other interconnects, buses, or plugs. FIG. 1 also shows an insulation layer 16 such as oxide, a first protective layer 18 such as silicon nitride, and a conductive layer 20 such as polycrystalline silicon.

Figure 2:
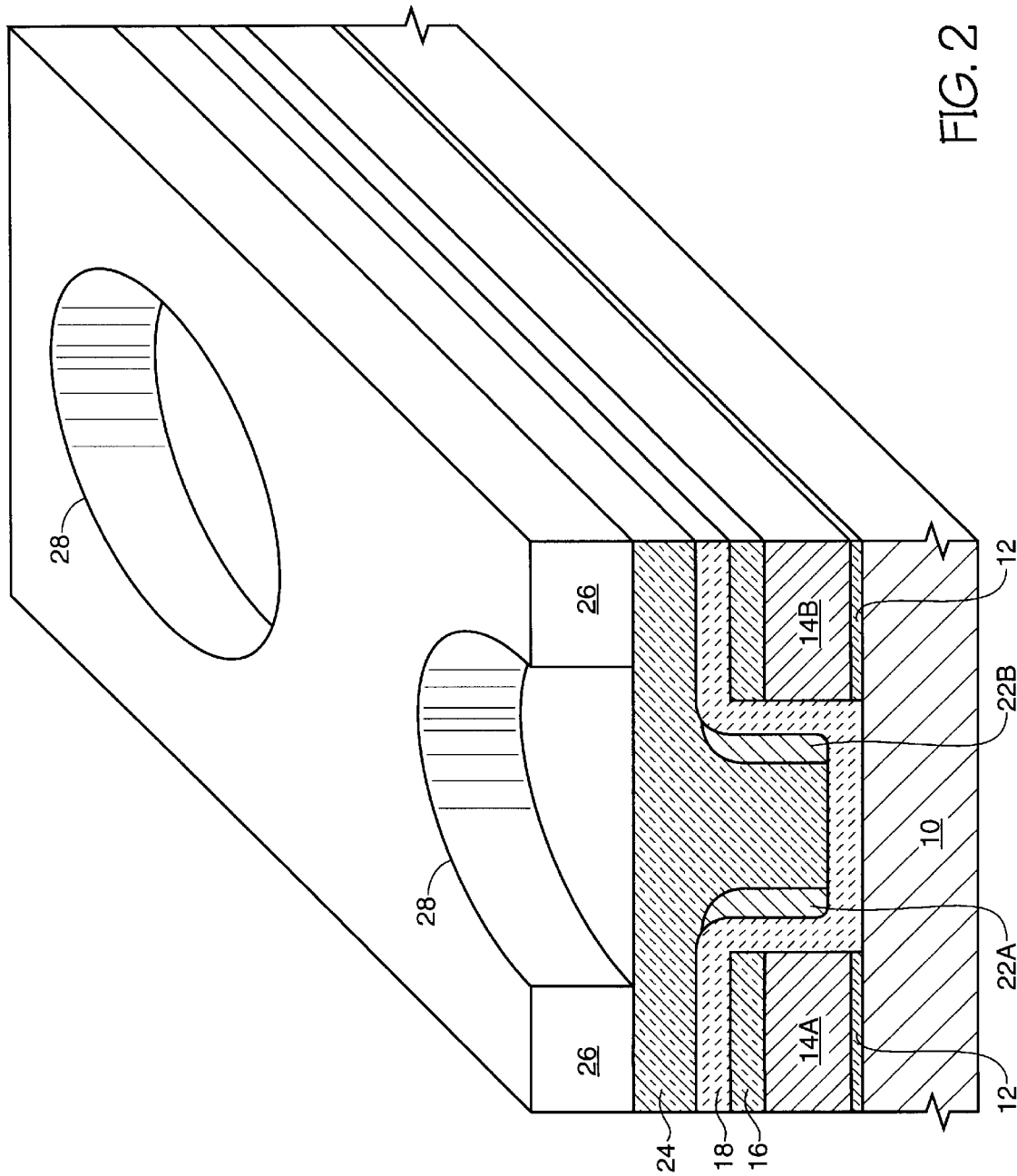
Figure 3:
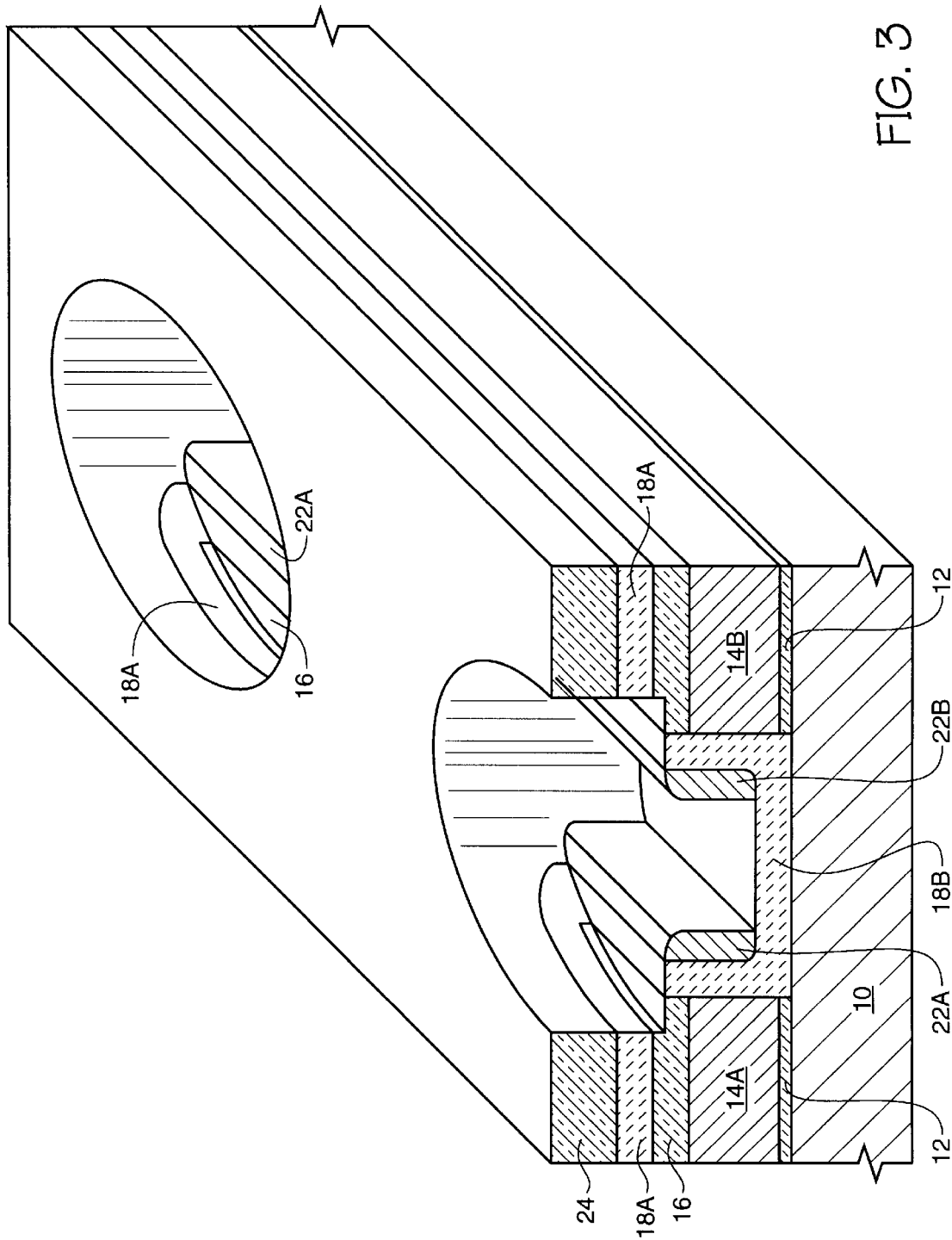

After forming the FIG. 1 structure, an anisotropic (vertical) etch is performed which etches the conductive layer 20 to form a conductive spacer 22A and 22B over each of the sidewalls of the first 14A and second 14B conductive lines as shown in FIG. 2 and over the first protective layer 18. FIG. 2 also shows a planarized insulation layer 24, such as a blanket layer of tetraethyl orthosilicate (TEOS), borophosphosilicate glass (BPSG), or another insulator formed over the conductive spacers 22A, 22B and over the wafer surface. A mask 26 having openings 28 therein is formed over the insulation layer 24. First and second portions of the insulation are removed, such as by etching, to form first and second openings in the insulation layer to expose the spacers 22A, 22B as shown in FIG. 3. The first protective layer is shown in FIG. 3 as elements 18A and 18B as it may be etched. Also shown in FIG. 3 is that layer 16 has also been etched somewhat, but layers 14A and 14B remain unetched.

Figure 4:
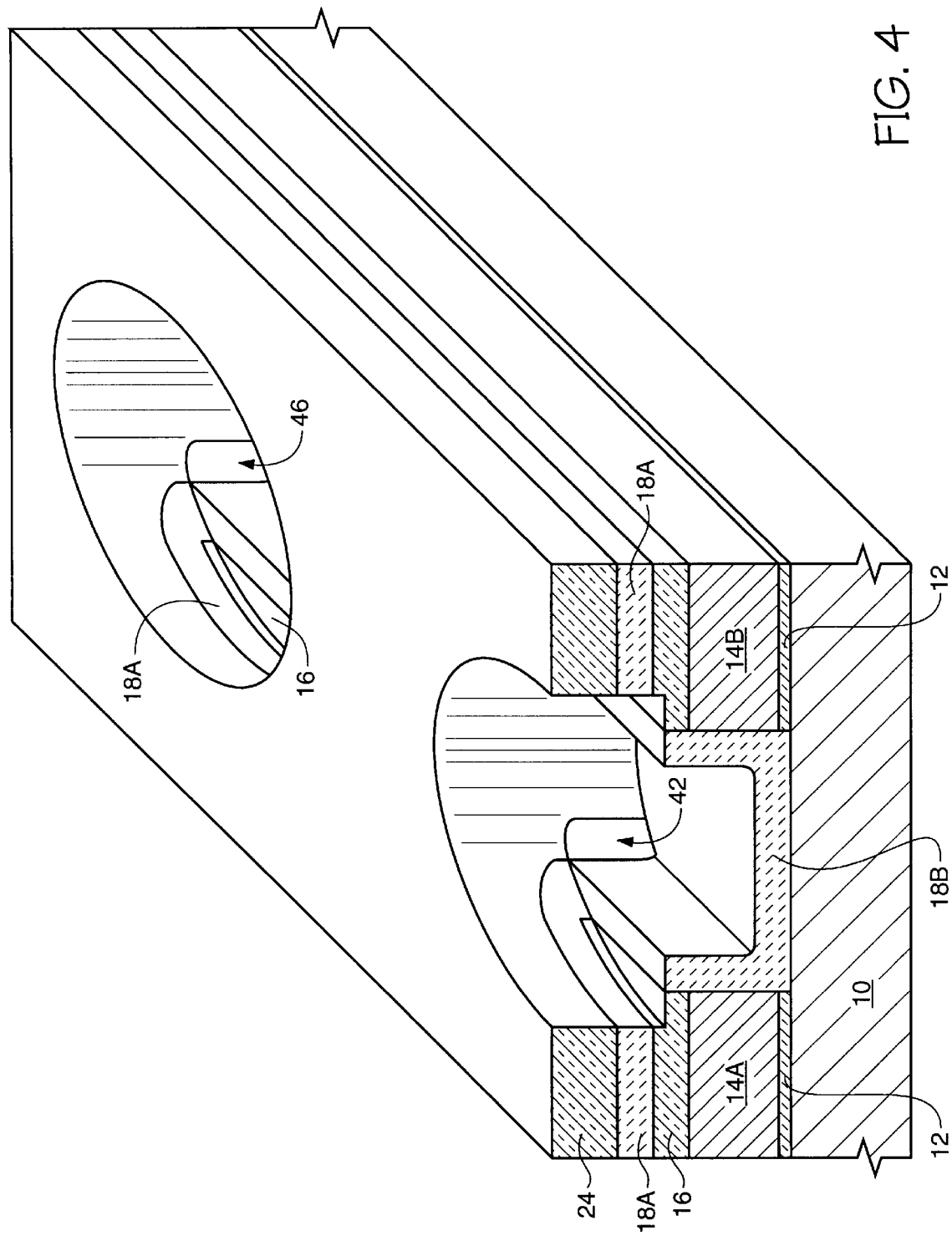
Figure 5:
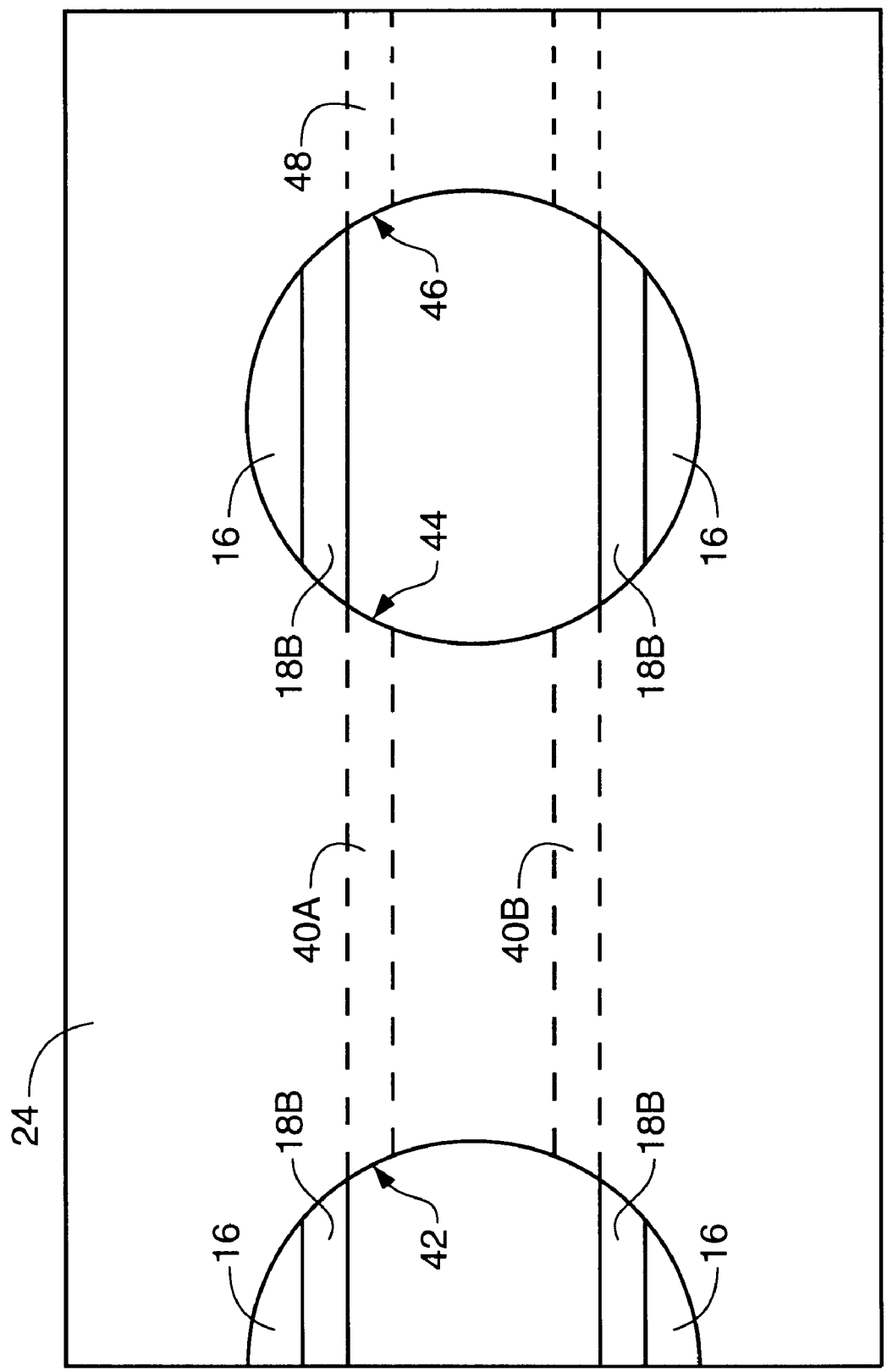
FIG. 5 is a top view of the structure of FIG. 4.

Next, the exposed portions of the spacers are removed as shown in FIG. 4. FIG. 5 is a top view of the FIG. 4 structure. Etches which remove conductive material such polycrystalline silicon and leave a protective material such as silicon nitride are known in the art such as various wet and dry etches. The spacers 40A and 40B cannot be completely removed since they are covered by the insulation layer 24 and therefore form a conductive path 40 between the first and second openings as they are manufactured from a conductive material. Spacer 40A therefore has a first end 42 and a second end 44 with one end at each of the openings in the insulation layer 24. Spacer 40B has similar first and second ends. FIGS. 4 and 5 also show a first end 46 of a third spacer 48.

The ends 42, 44 can each form a substantially vertical sidewall with one of the openings as shown in FIG. 4, or the etch may recess each end within the insulation layer due to an isotropic quality to the etch which removes the exposed portions of the spacers.

Figure 6:
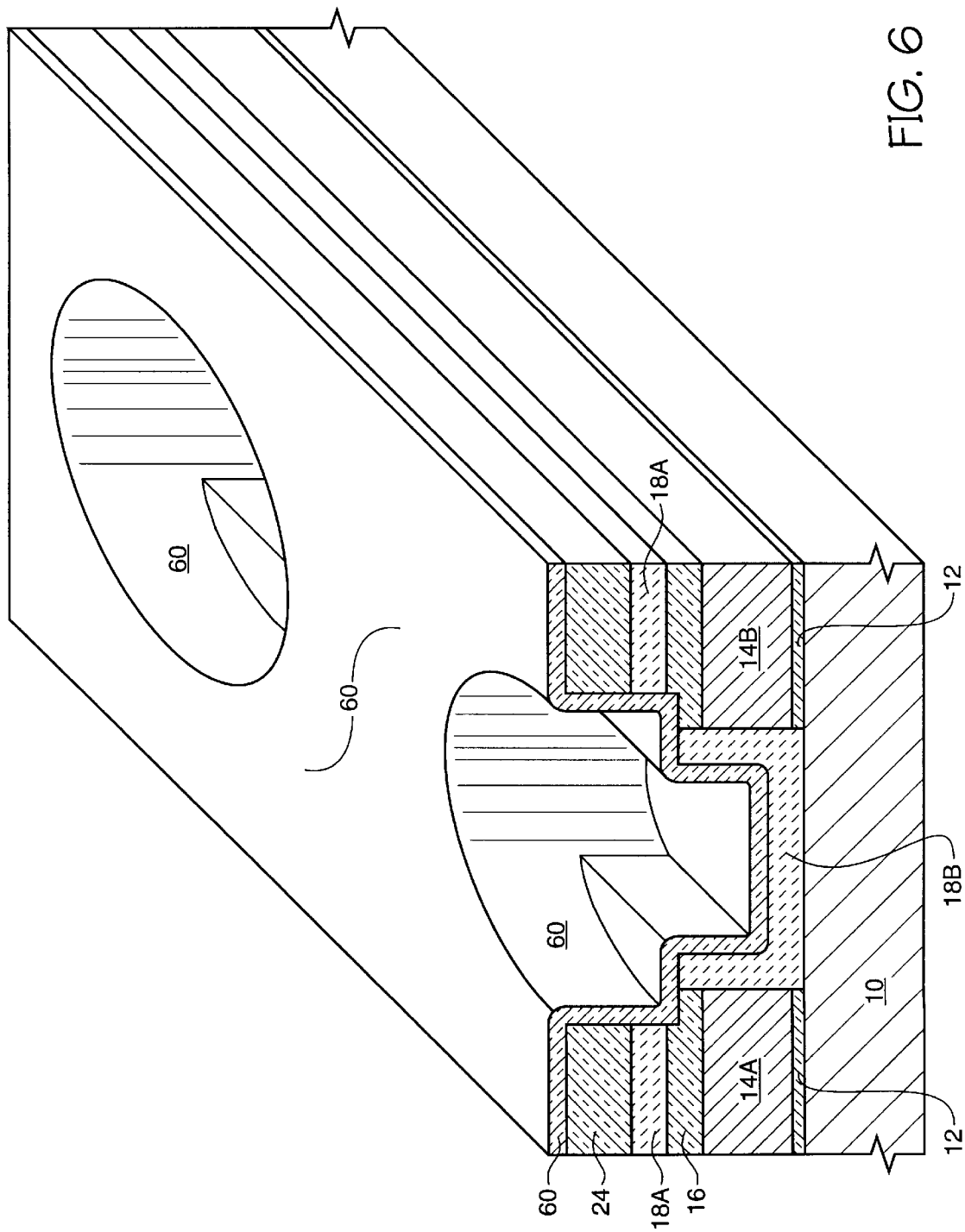

Next, as shown in FIG. 6, a second protective layer 60 which is an insulator such as silicon nitride is formed within the first and second openings which covers a portion of the spacers to remove the conductive path between the first and second openings. In this embodiment the protective layer 60 is formed as a blanket layer.

Figure 7:
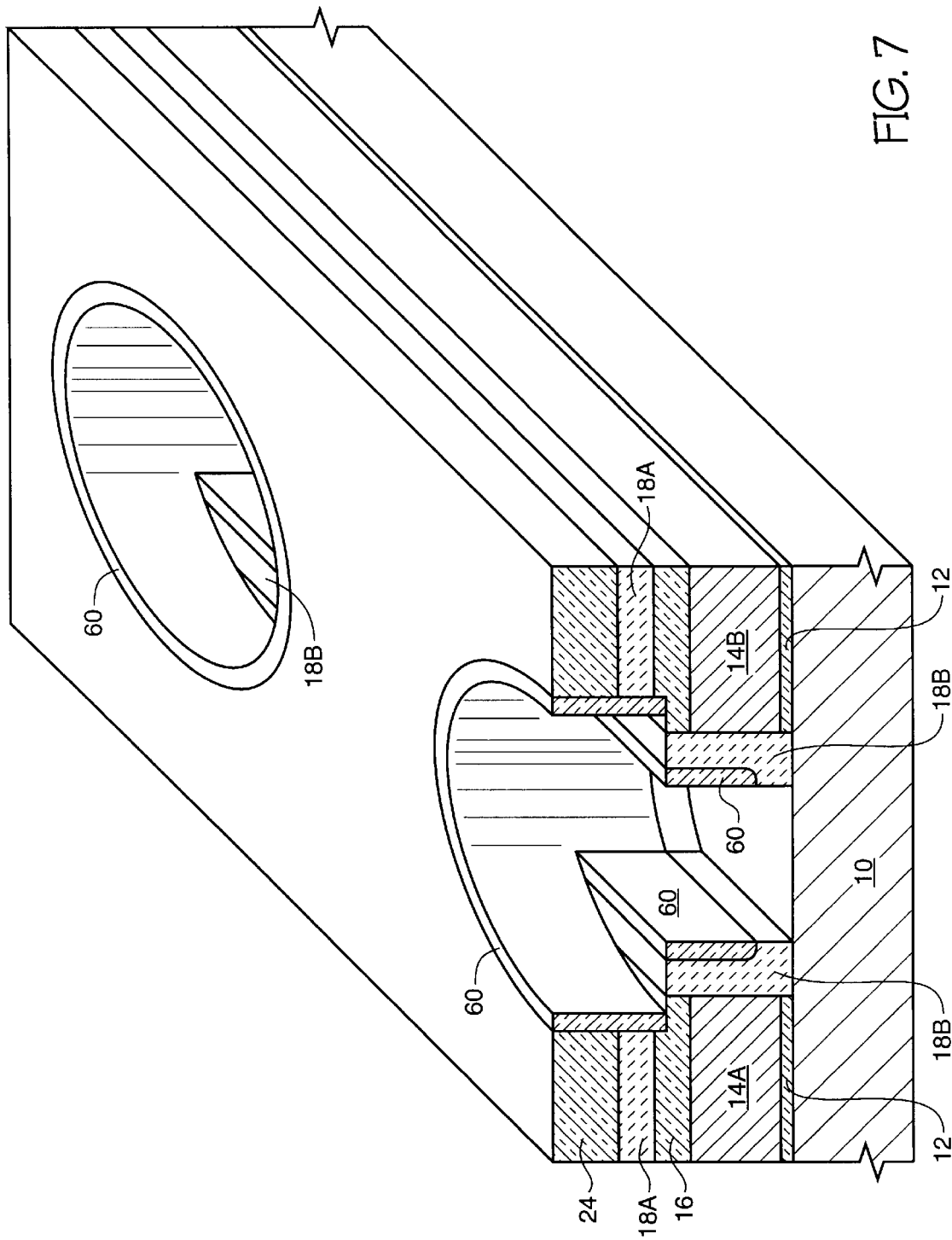

Finally, the second protective layer 60 is anisotropically etched which removes the second protective layer from horizontal surfaces and leaves the second protective layer covering vertical or near-vertical surfaces as shown in FIG. 7. The etch therefore leaves a portion of the protective layer covering the first and second ends of the conductive spacer, and exposes the underlying layer to which contact is to be made.

One advantage of this embodiment of the inventive process is that the conductive layer which forms spacers protects the conductive lines more efficiently than if the first protective layer 18 is used alone.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, many different types of underlying conductive or semiconductive layers can be contacted to, and many different materials and etches may function in place of those described herein. It is therefore contemplated that the appended claims will cover any such modifications or embodiments as fall within the true scope of the invention.

What is claimed is:

1. A semiconductor device comprising:
   a first dielectric layer having at least first and second openings therein each defined by a substantially vertical sidewall;
   an electrically conductive spacer comprising first and second ends each having a substantially vertical surface integral with one of said first and second sidewalls, wherein said conductive spacer electrically couples said first and second openings; and
   a second dielectric layer formed over said sidewall of each said opening and formed over said substantially vertical surface of each said spacer end.

2. The device of claim 1 wherein said conductive spacer is encased in insulation material and does not contact any electrically conductive structure.

3. The device of claim 1 wherein said second dielectric layer comprises at least first and second spacers.

4. The device of claim 1 wherein said conductive spacer comprises polycrystalline silicon.

5. The device of claim 1 wherein said electrically conductive spacer is formed from a 6. The device of claim 5 wherein said device is a completed semiconductor device.

7. A semiconductor device comprising:
   a first dielectric layer having at least first and second openings therein each defined by a substantially vertical sidewall;
   an electrically conductive spacer comprising first and second ends each having a substantially vertical surface recessed underneath said first dielectric layer such that said first dielectric layer comprises a void therein at said ends of said spacer; and
   a second dielectric layer formed over said sidewall of each said opening and formed over said substantially vertical surface of each said spacer end and within each said void in said dielectric layer at said ends of said spacer.

8. The device of claim 7 wherein said conductive spacer is encased in insulation material and does not contact any electrically conductive structure.

9. The device of claim 7 wherein said second dielectric layer is a spacer.

10. The device of claim 7 wherein said conductive spacer comprises polycrystalline silicon.

11. The device of claim 7 wherein said electrically conductive spacer is formed from a blanket conductive layer and said conductive layer does not contact any electrically conductive structure.

12. The device of claim 11 wherein said device is a completed semiconductor device. Micron

* * * * *

UNITED STATES PATENT AND TRADEMARK OFFICE
CERTIFICATE OF CORRECTION

PATENT NO. : 6,046,505  
DATED : April 4, 2000  
INVENTOR(S) : Bradley J. Howard Page 1 of 1

It is certified that error appears in the above-identified patent and that said Letters Patent is hereby corrected as shown below:

Title page,
Under item [22], please delete "Nov. 12, 1997" and insert -- Nov. 11, 1997 --.

Signed and Sealed this

Thirtieth Day of October, 2001

Attest:

NICHOLAS P. GODICI  
Attesting Officer    Acting Director of the United States Patent and Trademark Office